United States Patent [19]

Horsley

[11] 3,982,108

[45] Sept. 21, 1976

[54] HIGH-SPEED COUNTER WITH RELIABLE COUNT EXTRACTION SYSTEM

[75] Inventor: James Othel Horsley, Moorestown, N.J.

[73] Assignee: RCA Corporation, New York, N.Y.

[22] Filed: Mar. 31, 1975

[21] Appl. No.: 563,685

[52] U.S. Cl. ................ 235/92 EA; 235/92 DP; 235/92 FP; 235/92 R
[51] Int. Cl.² ........................................ H03K 21/08
[58] Field of Search ....... 235/92 EA, 92 DP, 92 FP; 328/50

[56] References Cited
UNITED STATES PATENTS

| | | | |
|---|---|---|---|
| 2,864,948 | 12/1958 | Neff | 235/92 EA |
| 3,063,631 | 11/1962 | Ray | 235/92 EA |
| 3,560,723 | 2/1971 | Kamachi | 235/92 EA |

*Primary Examiner*—Joseph M. Thesz
*Attorney, Agent, or Firm*—Edward J. Norton; Carl M. Wright

[57] ABSTRACT

High-speed counter provided with storage device for extracting the count value reliably without interrupting the operation of the counter.

2 Claims, 4 Drawing Figures

HIGH-SPEED COUNTER WITH RELIABLE COUNT EXTRACTION SYSTEM

The invention herein described was made in the course of or under a contract or subcontract thereunder, with the Department of the Army.

BACKGROUND OF THE INVENTION

High-speed counters from which the count value can be reliably extracted are useful in such systems as radar range measuring equipment, multiple time interval measurement systems, frequency monitoring systems, and the like. In most such equipment, accuracy improves with the speed of the counter. When using high-speed counters, however, it is difficult to read out the value in the counter without disturbing its operation or obtaining a wrong value. The count extraction scheme tends to become more complex when the input pulses being counted are not evenly spaced.

To extract the count between input pulses is difficult for two reasons. The storage registers must be as fast as the fastest counting stage, viz., the least significant bit. Furthermore, the ripple carry is liable to cause an error at some stage because its location can not be ascertained. This second difficulty can be somewhat alleviated by using a synchronous counter, but this makes the counter more complex and expensive. It is not usually feasible to segment the synchronous counter because this again introduces an unpredictable propagation delay between the segments.

A reliable count extraction is one in which there is no error (or anomaly) or, if there is an error, it is known.

The invention disclosed herein describes a high-speed counter having a count extraction means which does not interrupt the counting of the counter, uses few high speed stages, and resolves any anomolies in the extracted count value.

BRIEF DESCRIPTION OF THE INVENTION

A counter is connected to a source of pulses to be counted and is divided into a plurality of low order stages and a plurality of high order stages. A first storage means is provided for storing the count value from the low order stages in response to the pulses to be counted. A control signal inhibits the first storage, and a storage control responsive to the first storage means, to the control signal, and to the low order stages of the counter produces a store signal which activates a second storage which stores the count value from the high order stages.

DETAILED DESCRIPTION OF THE INVENTION

Although applicable to both upcounters and downcounters, the embodiment described herein shows an upcounter. After the invention is known, it is within the skill of the art to apply it to downcounters.

Figure 1:
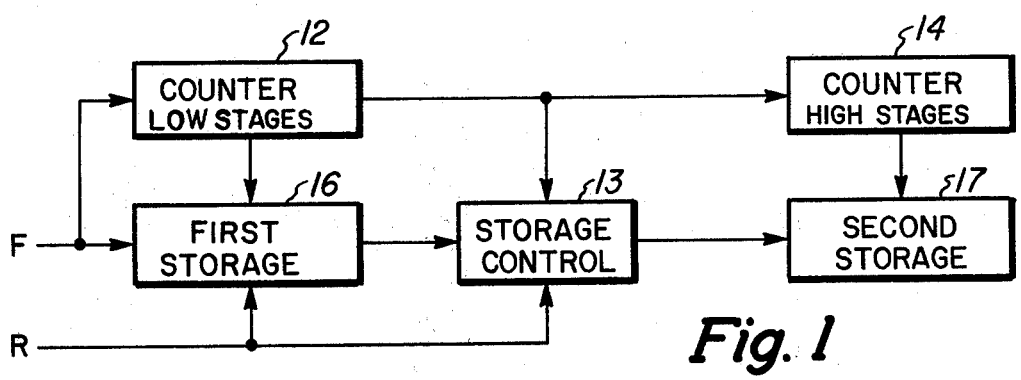
FIG. 1 is a block diagram of a preferred embodiment of the invention.

In FIG. 1, a counter, shown divided into low order stages 12 and high order stages 14, receives pulses to be counted; the pulses are also applied to a first storage 16. When the count is to be extracted from the counter 12, 14, a control signal is applied to the first storage 16 and to a storage control 13. The output signal from the storage control 13 is a store signal which causes the count value in the counter high stages 14 to be stored in a second storage 17. Application of the control signal to the first storage 16 inhibits its response to the input pulses being counted.

The count value stored in the first storage 16 is, because of its structure, one count behind the value in the counter low stages 12. During the counting operation, a store signal is produced by the storage control 13 whenever the count value in the counter high stages 14 is changed. In response to the control signal, a store signal may or may not be produced depending on the value of the most significant stage of the first storage 16.

If the most significant stage of the first storage 16 is set (reset in downcounter), then the counter high stages 14 are not transitory, i.e., were not changed by the previous pulse counted. This follows from the fact that the first storage 16 is one count behind the counter low stages 12 and that the counter operates in a predictable manner. The most significant stage of the first storage 16 being set is a result of the most significant stage of the counter low stages 12, being set when the previous input pulse occurred. If it is no longer set, then the counter high stages 14 have already changed and been stored in the second storage 17; if it is still set, there was no change in the high stages in response to the previous pulse. Therefore, the next storage control signal need not be generated.

If the most significant bit of the first storage 16 is reset (set in downcounters), the counter high stages 14 may have been changed by the preceding pulse and the second storage may not have been updated by the storage control 13 depending on the position of the control signal in relation to the output signal from the most significant of the low order stages 12 of the counter. Therefore, an additional storage pulse is produced to the second storage 17 to resolve any anomolies in the count stored in the second storage 17. Because the first storage 16 lags the first stages of the counter 12 by one, the stored number is always one less than the count. Therefore, the count extracted is reliable.

The number of stages in the counter low stages 12 (and the first storage 16) depends on the relationship of the slowest counter speed and the highest frequency to be counted. As the frequency to be counted decreases or the speed of the counter stages increase, the number of low order stages can be decreased. For higher frequencies or slower counter speeds, the number of stages in the low stages of the counter 12 are increased until the transfer clock period can support the circuit delay.

Figure 2:
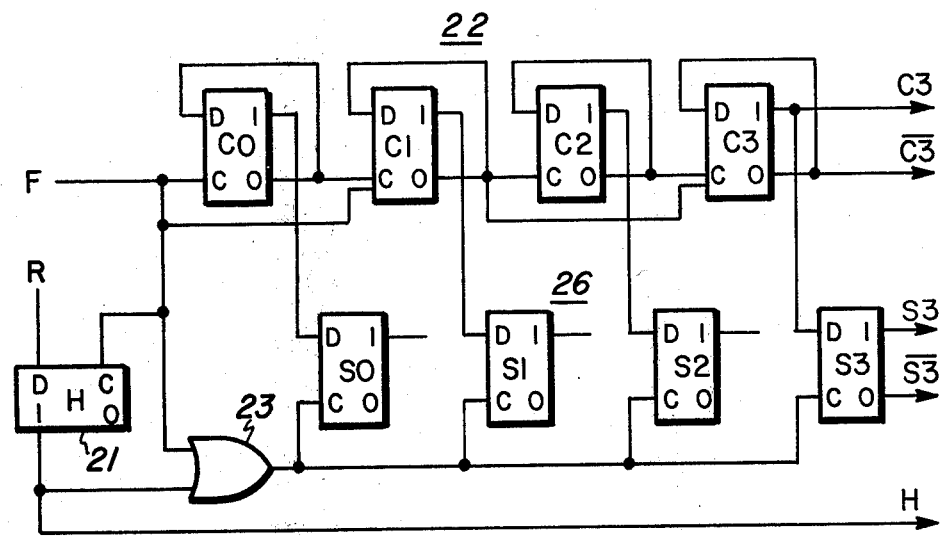
FIG. 2 is a logic diagram of the low order stages of the counter and the first storage.

The details of the first storage 16 and the counter low stages 12 are shown in FIG. 2. FIG. 2 illustrates a system in which the stage delays are such that the counter low stages 22 and first storage 26 can each be comprised of four flip-flops.

The counter low stages 22 (corresponding to 12 in FIG. 1) are shown as D type flip-flops. A D type flip-flop stores the logical value at the D input on the rising edge of a signal at the C input. The first two stages and the second two stages of the counter 22 are coupled to count synchronously. This increases the speed of the counter but the principle of the invention does not depend on the type of counter used. The double input shown at the C terminal of several of the flip-flops represents an internal OR gate in the flip-flop itself. (See, for example, Motorola type MC1670).

The first storage 26 (corresponding to 16 in FIG. 1) comprises four flip-flops with the D inputs connected to the set output singals from the counter stage in the corresponding position. A pulse at the C input causes each flip-flop stage to store the value that was in the corresponding counter stage at the rising edge of the pulse. The D type flip-flop requires a certain set-up time for the signal at the D input. That value is stored on the rising edge of the C input signal and a subsequent change of signal at the D input has no effect on the state of the flip-flop.

The input pulse to be counted also provides a C input signal for a flip-flop 21, the D input signal of which is the control signal. Before the count extraction operation, the control signal is a logical zero (low) so the flip-flop 21 remains in the reset condition. When the control signal is present, i.e., a logical one (high), the pulse to be counted causes the flip-flop 21 to be set which applies a logical one to an OR gate 23 which supplies the C input signals to the first storage 26. This causes the storage stages to store the value from the counter 22 but the high set output signal from the flip-flop 21 remaining on the OR gate input prevents the flip-flops from recognizing subsequent pulses that are to be counted. That is, the output of the OR gate remains high and thus produces no rising edge in response to the pulses to be counted so that the first storage 26 remains in the same state. The set output signal from the flip-flop 21 is coupled to the storage control as an H signal. The set and reset output signals from the most significant stages of the counter 22 and the storage 26 are coupled to the storage control as C3, $\overline{C3}$ and S3, $\overline{S3}$ signals, respectively. The signals C3 and $\overline{C3}$ are also coupled to the counter high stages.

Figure 3:
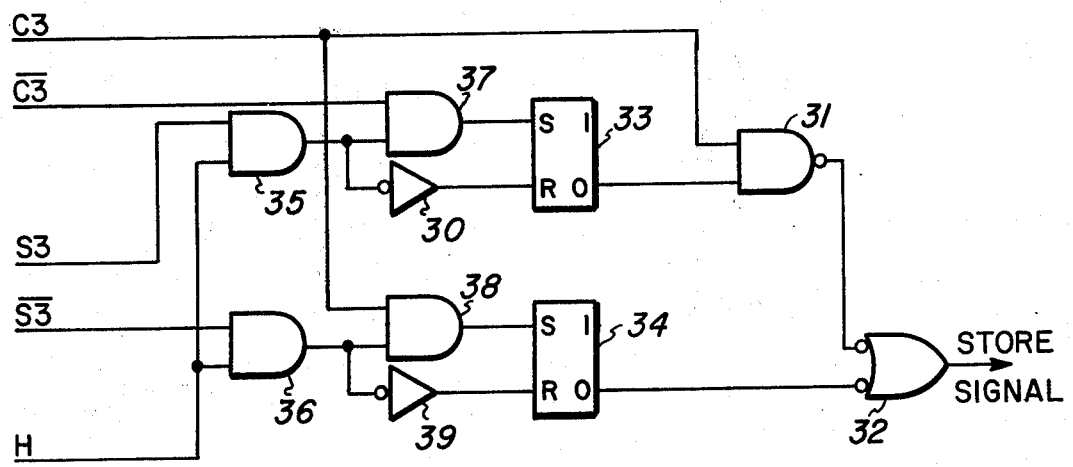
FIG. 3 is a logic diagram of the storage control.

FIG. 3 shows the details of the storage control 13 from FIG. 1. The set output signal C3 from the most significant stage of the counter (22 in FIG. 2) enables a NAND gate 31, the output of which enables another NAND gate 32, coupled to perform the OR function, to produce a store signal when a flip-flop 33 is reset. The flip-flop 33 and a flip-flop 34 are set only in conjunction with an H signal from the first storage which occurs in response to a control signal. Therefore, in the absence of a control signal, a store signal is produced by the C3 output signal and operates to store the count from the counter high stages which was changed by the previous low level of the C3 output signal as will be explained in more detail below.

If the H signal occurs when the set output of the most significant bit of the first storage, S3, is high, the second storage 17 of FIG. 1 contains the count value from the counter high stages 14 and the store signal can be disabled. The H and S3 signals will activate an AND gate 35, whose output signal enables an AND gate 37 which is primed by the reset output signal $\overline{C3}$ from the most significant stage of the counter low stages. The output signal from the AND gate 37 sets the flip-flop 33 which inhibits the NAND gate 31, preventing the generation of store pulses by the C3 signal via the gate 32. The AND gate 37, the flip-flop 33, and the AND gate 31 perform the function of inhibiting the store signals when the most significant bit of the first storage, S3, indicates that the contents of the high stages of the counter were not changed and that the second storage contains the proper count value. Using the signal $\overline{C3}$ to set the flip-flop 33 inhibits the store signals without creating partial signals, i.e., transients of spikes. If the most significant bit, S3, from the storage means is set at the time that the $\overline{C3}$ output signal is high, the C3 output signal will not enable the AND gate 37, permitting the C3 output signal to be gated via the gates 31 and 32 to produce a store signal to control the storage of the high stages of the counter. At the next transition of the most significant stage of the low stages, i.e., when the $\overline{C3}$ output signal goes high, the AND gate 37 is enabled and the gate 31 is disabled.

If the most significant stage of the first storage is not set, i.e., $\overline{S3}$ is high, the second storage does not contain the proper count value. If the H control signal occurs when the S3 signal is high, an additional store signal must be generated to store the proper count value. The H signal enables an AND gate 36 which primes an AND gate 38. If the C3 output signal is high, the AND gate 38 is enabled and sets the flip-flop 34. The reset output signal from the flip-flop 34 activates the gate 32 causing the store signal to be latched as a high output signal. This store signal removes any ambiguities of count because if the high stages had previously changed, the correct value would thereby be stored in the second storage.

From FIG. 2, it is seen that two pulses are required to update the first storage when the control signal is removed. The first pulse after the removal of the control signal resets the flip-flop 21, but the output signal from the OR gate 23 remains high because of the presence of the pulse itself. Therefore, the next pulse will create a rising edge from the OR gate 23 to update the storage 26. When the flip-flop 21 is reset, the removal of the H signal from the AND gates 35 and 36 (FIG. 4) produces a low output signal on each which is inverted by the inverters 30 and 39 to reset the flip-flops 33 and 34. This restores the generation of store signals by C3 via the gates 31 and 32. Thus, it has been shown how the high speed counter value can be stored reliably in response to a control signal without interrupting the counter.

Figure 4:
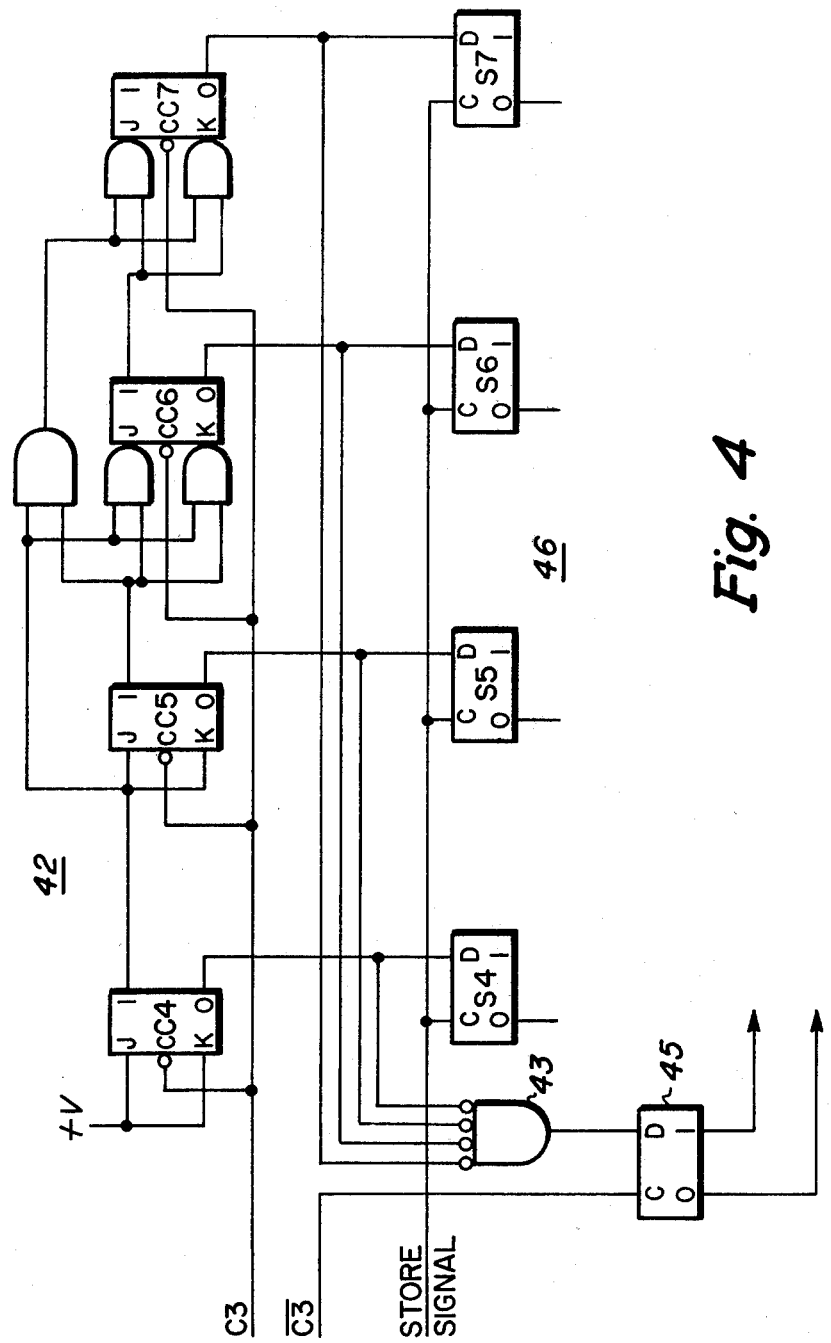
FIG. 4 is a logic diagram of the high order stages of the counter and the second storage means.

FIG. 4 shows the details of an implementation of the counter high stages 14 and the second storage 17 from FIG. 1. In FIG. 4, the high stages 42 are shown as four JK-type flip-flops and the second storage 46 is four D type flip-flops. The JK flip-flops used in the high stages 42 are triggered by the negative-going edge of the C3 signal. A JK flip-flop is set if the J input is present and the K input signal is absent at the occurrence of a negative-going edge of the clock pulse; it is reset if the K input signal is present and the J input signal is absent at the negative-going edge of the clock pulse; and if both input signals are present, then the negative-going edge of the clock pulse causes the flip-flop to change stage. The C3 signal from the low order stages triggers the counter high stages 42 which are coupled as a synchronous counter. Synchronous means that all the stages change in response to the same input signal as distinguished from a ripple type counter in which each subsequent stage change is delayed by the time it takes the previous stage to change.

The second storage 46 stores the count value from the high stages 42 in response to the store signal generated by the storage control logic. The circuit of FIG. 4 shows the reset output signal from the counter stages being stored in the second storage 46 so the storage read-out is taken from the reset output side of the storage flip-flops. This method has the advantage of reducing the load on the set output signal, thereby maintaining fast speed.

The pulse (polarity) of the C3 output signal and the store signal is the same in the illustrated embodiment, but the counter stages 42 are triggered by the negative-going edge of the C3 signal whereas the storage stages 46 are triggered by the positive-going edge of the storage signal. Therefore, the change in the high order stages 42 is a half cycle before the storage of the count value in the second storage flip-flops 46. An important feature of the invention is that the counter high stages and second storage be triggered by signals out of phase, e.g., by different half cycles of the signal from the most significant stage of the counter low stages. It is within the ordinary skill of the art to employ this phase difference in different ways. For example, if the high stage counters and second storage respond to the same signal polarity, the input signal to one of them can be inverted. Examples of devices that can be used for the counter stages 42 are SN74106 (single JK inputs) and SN7472 (ANDed JK inputs). An entire high speed synchronous counter is commercially available as type SN74S163. (These IC types are made by Texas Instruments, Inc., Signetics, National Semiconductor, inter alia.)

Also shown in FIG. 4 is an NOR gate 43, which primes the D input of a flip-flop 45 when all the stages in the counter 42 are set. The next $\overline{C3}$ signal at the clock input to the flip-flop 45 stores the signal and produces a negative-going output signal from the reset output terminal. The flip-flop output signals can be carried forward to higher order synchronous counters. The reset output signal from the flip-flop 45 performs the function of C3 to the next counter stages and the set output signal, the function of $\overline{C3}$. The store signal can also be carried forward. As noted above, this permits cascading synchronous counters without necessitating gates with excessive fan-in capabilities. The invention, however, can be implemented with asynchronous counters as well.

It has been shown how the count values in a high speed counter can be stored reliably without interrupting the counting operation. This is possible by the generation of a store signal which removes ambiguities that might exist at the interface of the high speed and low speed counter stages.

Various modifications to the circuits and logic described and illustrated to explain the concepts and modes of practicing the invention might be made by those of ordinary skill in the art within the principle or scope of the invention as expressed in the appended claims.

What is claimed is:
1. The combination comprising,
counter means coupled to a source means for pulses to be counted, said counter means being divided into a first plurality of low order stages and a second plurality of high order stages;
first storage means for storing the count value in said first plurality of stages in response to said pulses to be counted;
means responsive to a first control signal for inhibiting the first storage means;
storage control means responsive to said first storage means, to said first control signal, and to said first plurality of stages for producing a store signal; and
second storage means coupled to the second plurality of stages for storing its count value in response to said store signal.
2. The invention as claimed in claim 1 wherein said storage control means includes
means for producing said store signal after a change in value in said second plurality of stages in the absence of said first control signal;
means responsive to the presence of said first control signal for inhibiting the producing of said store signal when the most significant stage of said first storage means is set; and
means responsive to the presence of said first control signal for producing said store signal when said most significant stage is reset.

* * * * *